Nov. 19, 1968 L. F. TARICO 3,412,266
ELECTRONIC SWITCH
Filed Dec. 22, 1965
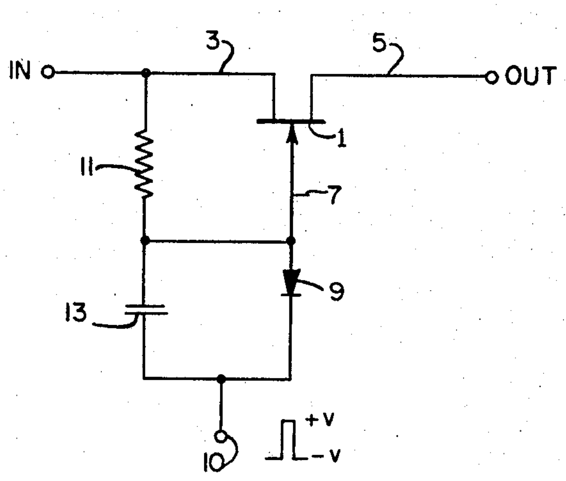
INVENTOR
LEROY FRANK TARICO
BY
Mueller, Aichele & Rauner
ATTYS.

United States Patent Office 3,412,266
Patented Nov. 19, 1968

3,412,266
ELECTRONIC SWITCH

Leroy Frank Tarico, Scottsdale, Ariz., assignor to Motorola, Inc., Franklin Park, Ill., a corporation of Illinois Filed Dec. 22, 1965, Ser. No. 515,699
4 Claims. (Cl. 307—251)

ABSTRACT OF THE DISCLOSURE

A field-effect transistor (FET) is switched between current conductivity and nonconductivity by a unidirectional current-conducting device, such as a diode, connected to the gate electrode and pole to make the FET nonconductive when the device is conducting current. A capacitor is connected across the device and a resistor is connected between the gate electrode to another electrode of the transistor.

This invention relates to an electronic switch and more particularly to such a switch including a field effect transistor.

In electronic switching circuits with high current capabilities, the junction transistor is commonly used. Because the operation of the junction transistor is controlled by a current through the base, it is impossible to apply it to a switching device requiring high current capability, when only a very small amount of control power is present. In order to overcome this disadvantage it has been proposed to utilize a field effect transistor, which needs very little control power. However, the use of a transformer is necessary to maintain isolation of the switch circuit from ground.

Accordingly, it is an object of this invention to provide a simple, inexpensive field effect transistor switching circuit.

It is another object of the invention to provide a field effect transistor switching circuit wherein the channel of the transistor is isolated from ground.

A feature of this invention is the provision of a field effect switching circuit having a semiconductor diode connected between the gate electrode and the switching voltage supply means.

A further feature of the invention is the provision of such a circuit with capacitor in parallel with the semiconductor diode, and a resistor connected between the gate and the input of the channel.

The invention is illustrated in the drawing in which the single figure shows a switching circuit according to the invention.

In brief, the present invention realizes an advantageous field effect transitor switch by connecting a semiconductor diode to the gate electrode and applying a switching voltage through the semiconductor diode to the gate electrode. In parallel to the semiconductor diode, there is connected a capacitor which assists the switching of the semiconductor diode, when it switches the field effect transistor. A resistor is connected between the input electrode and the gate electrode to provide a current path through the diode when the switching voltage renders the semiconductor diode conductive.

In the drawing, a field effect transistor switching circuit with a P-type channel region is shown. It is obvious that the switching circuit can be implemented with either P or N type channel or insulated gate field effect devices. When a N-type channel region is used, the diode 9 must be connected with opposite polarity.

The source electrode 3 and drain electrode 5 of the field effect transistor represent the input and output of the switching circuit. The gate electrode 7 is connected through a diode 9 to a terminal 10 at which a switching voltage, preferably a square-wave voltage, is applied. A resistor 11 is connected to the source electrode 3 and in series through a capacitor 13 to the terminal 10. The junction of the resistor and capacitor is connected to the gate electrode 7.

The switch is voltage controlled and has the following operation. When plus voltage is applied to terminal 10, diode 9 becomes reversed biased. The voltage at the gate electrode 7 first rises, being applied through capacitor 13, switching on the field effect transistor very fast. Then the voltage at the gate electrode tends to follow the input voltage at the source electrode 3, which is applied to the gate electrode through resistor 11. In this state, the field effect transistor is fully on.

In order to turn the switch off, it is necessary to apply a minus voltage to terminal 10. This causes, in the first moment, a voltage at the gate electrode 7, which is the sum of the applied voltage and the voltage across the capacitor 13. Thus, the gate electrode is biased with a high minus voltage, switching the field effect transistor off. The capacitor 13, however, discharges very fast so that after a very short time the diode is caused to be forward biased conducting a current from the source electrode 3 through resistor 11 and diode 9 to terminal 10, and applying the minus switching voltage to the gate electrode 7 holding the field effect transistor fully switched off.

For an application of the electronic switch with a low repetition rate the capacitor 13 can be omitted. In such case, the current through the diode 9 will turn off so that the potential at gate electrode 7 is the same as the input potential applied to the source electrode 3 which will render the field effect transistor conductive.

Depending on the application of the switch, the resistor 11 may be omitted. The diode 9 operates as a clamping device to prevent the capacitor from charging to a very high voltage.

The great advantage of the invention is that the switch can be driven without a transformer, thereby avoiding the expense of the transformer and matching circuits. Also, the very small control power needed, coupled with high current capabilities, are features not found in present electronic switches.

I claim:

1. A field effect transistor switching device, including in combination, a field effect transistor having a channel input electrode, a channel output electrode and a gate electrode, voltage supply means for providing a switching voltage, a semiconductor diode connected between said gate electrode and said voltage supply means switching said field effect transistor off when said semiconductor diode is conducting, capacitor means connected in parallel with said semiconductor diode, and said capacitor means cooperating with said semiconductor diode for controlling the switching action of said field effect transistor.

2. A field effect transistor in accordance with claim 1 wherein capacitor means are connected in parallel with said semiconductor diode, said capacitor cooperating with said semiconductor diode for controlling the switching action of said field effect transistor.

3. A field effect transistor in accordance with claim 2 wherein resistor means are connected between said input electrode and said gate electrode and providing a current path through the diode when said switching voltage switches the field effect transistor off.

4. A switching device including in combination a field-effect transistor having a channel input electrode, channel output electrode and a gate electrode, with the transistor being responsive to a predetermined voltage on said gate electrode to become conductive and responsive to a different voltage to become nonconductive as between the two channel electrodes, a selectively conductive unidirectional current-conducting device connected to said gate electrode and poled such that when it conducts current said another voltage is on said gate electrode and when nonconductive the first mentioned voltage appears on said gate electrode, a resistor connected between one of said channel electrodes and said device and a capacitor connected across said device and said device adapted to receive signals for becoming current conductive or nonconductive to thereby control the conductivity of said field-effect transistor.

References Cited

UNITED STATES PATENTS 3,018,391 1/1962 Lindsay ------------ 307—251

OTHER REFERENCES

"Electronics" (magazine), Analog Switching Circuits Use Field—Effect Devices, by M. Shipley, Sr., December 1964, pp. 45–53.

ARTHUR GAUSS, *Primary Examiner.*

B. P. DAVIS, *Assistant Examiner.*